(12) United States Patent
Forbes

(10) Patent No.: US 6,952,362 B2
(45) Date of Patent: *Oct. 4, 2005

(54) FERROELECTRIC WRITE ONCE READ ONLY MEMORY FOR ARCHIVAL STORAGE

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/789,041

(22) Filed: Feb. 27, 2004

(65) Prior Publication Data

US 2004/0165412 A1 Aug. 26, 2004

Related U.S. Application Data

(63) Continuation of application No. 10/177,082, filed on Jun. 21, 2002.

(51) Int. Cl.[7] .......................... G11C 11/22; G11C 11/24
(52) U.S. Cl. ...................................... 365/145; 365/149
(58) Field of Search ................................ 365/145, 149; 438/3

(56) References Cited

U.S. PATENT DOCUMENTS

| | | | |
|---|---|---|---|
| 3,641,516 A | 2/1972 | Casrucci et al. ............... 365/96 |
| 3,665,423 A | 5/1972 | Nakamuma et al. | |
| 3,877,054 A | 4/1975 | Boulin et al. .................. 357/23 |
| 3,964,085 A | 6/1976 | Kahng et al. ................ 428/428 |
| 4,152,627 A | 5/1979 | Priel et al. .................... 315/227 |
| 4,217,601 A | 8/1980 | DeKeersmaecker et al. .. 357/54 |
| 4,888,733 A | 12/1989 | Mobley ........................ 365/145 |
| 5,042,011 A | 8/1991 | Casper et al. ................ 365/205 |
| 5,280,205 A | 1/1994 | Green et al. .................. 307/530 |
| 5,303,182 A * | 4/1994 | Nakao et al. ................. 365/149 |
| 5,399,516 A | 3/1995 | Bergendahl et al. ............ 437/43 |
| 5,410,504 A | 4/1995 | Ward ........................... 365/149 |
| 5,457,649 A | 10/1995 | Eichman et al. ............. 365/174 |
| 5,530,581 A | 6/1996 | Cogan ........................ 359/265 |
| 5,530,668 A | 6/1996 | Chern et al. ................. 365/145 |
| 5,539,279 A | 7/1996 | Takeuchi et al. ............. 365/145 |
| 5,541,871 A | 7/1996 | Nishimura et al. .......... 365/145 |
| 5,541,872 A | 7/1996 | Lowrey et al. | |
| 5,550,770 A | 8/1996 | Kuroda ........................ 365/145 |
| 5,572,459 A | 11/1996 | Wilson et al. ............... 365/145 |
| 5,600,587 A | 2/1997 | Koike .......................... 365/145 |
| 5,627,785 A | 5/1997 | Gilliam et al. ........... 365/189.01 |
| 5,740,104 A | 4/1998 | Forbes ..................... 365/185.03 |
| 5,768,192 A | 6/1998 | Eitan ...................... 365/185.24 |

(Continued)

OTHER PUBLICATIONS

Abbas, S. A., et al., "N–Channel Igfet Design Limitations Due to Hot Electron Trapping", *Technical Digest, International Electron Devices Meeting,*, Washington, DC,(Dec. 1975),35–38.

(Continued)

*Primary Examiner*—Trong Phan
(74) *Attorney, Agent, or Firm*—Schwegman, Lundberg, Woessner & Kluth, P.A.

(57) ABSTRACT

Structures and methods for ferroelectric write once read only memory adapted to be programmed for long retention archival storage are provided. The write once read only memory cell includes a charge amplifier transistor. The transistor includes a source region, a drain region, and a channel region located between the source and the drain regions. A gate stack is located above the channel region. The gate stack includes; a gate oxide layer, a polysilicon interconnect on the gate oxide, a ferroelectric dielectric coupled to the polysilicon interconnect, and a control electrode coupled to the ferroelectric dielectric. A plug couples the source region to an array plate. A transmission line is coupled to the drain region.

23 Claims, 10 Drawing Sheets

U.S. PATENT DOCUMENTS

| | | | |
|---|---|---|---|
| 5,801,401 A | 9/1998 | Forbes | 257/77 |
| 5,828,605 A | 10/1998 | Peng et al. | 365/185.29 |
| 5,852,306 A | 12/1998 | Forbes | 257/315 |
| 5,856,688 A | 1/1999 | Lee et al. | 257/295 |
| 5,886,368 A | 3/1999 | Forbes et al. | 257/77 |
| 5,912,488 A | 6/1999 | Kim et al. | 257/316 |
| 5,936,274 A | 8/1999 | Forbes et al. | 257/315 |
| 5,943,262 A | 8/1999 | Choi | 365/185.17 |
| 5,973,356 A | 10/1999 | Noble et al. | 257/319 |
| 5,989,958 A | 11/1999 | Forbes | 438/257 |
| 5,991,225 A | 11/1999 | Forbes et al. | 365/230.06 |
| 6,031,263 A | 2/2000 | Forbes et al. | 257/315 |
| 6,034,882 A | 3/2000 | Johnson et al. | 365/103 |
| 6,072,209 A | 6/2000 | Noble et al. | 257/296 |
| 6,115,281 A | 9/2000 | Aggarwal et al. | 365/145 |
| 6,125,062 A | 9/2000 | Ahn et al. | 365/198.07 |
| 6,140,181 A | 10/2000 | Forbes et al. | 438/257 |
| 6,141,237 A | 10/2000 | Eliason et al. | 365/145 |
| 6,141,238 A | 10/2000 | Forbes et al. | 365/145 |
| 6,141,260 A | 10/2000 | Ahn et al. | 365/189.07 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,166,401 A | 12/2000 | Forbes | 257/77 |
| 6,185,122 B1 | 2/2001 | Johnson et al. | 365/103 |
| 6,194,228 B1 * | 2/2001 | Fujiki et al. | 438/3 |
| 6,203,613 B1 | 3/2001 | Gates et al. | 117/104 |
| 6,212,103 B1 | 4/2001 | Ahrens et al. | 365/185.29 |
| 6,232,643 B1 | 5/2001 | Forbes et al. | 257/405 |
| 6,238,976 B1 | 5/2001 | Noble et al. | 257/315 |
| 6,243,300 B1 | 6/2001 | Sunkavalli | 365/185.29 |
| 6,246,606 B1 | 6/2001 | Forbes et al. | 365/185.03 |
| 6,249,020 B1 | 6/2001 | Forbes et al. | 257/315 |
| 6,252,793 B1 | 6/2001 | Allen et al. | 365/145 |
| 6,269,023 B1 | 7/2001 | Derhacobian et al. | 365/185.24 |
| 6,281,144 B1 | 8/2001 | Cleary et al. | 438/780 |
| 6,294,813 B1 | 9/2001 | Forbes et al. | 257/321 |
| 6,297,539 B1 | 10/2001 | Ma et al. | 257/410 |
| 6,302,964 B1 | 10/2001 | Umotoy et al. | 118/715 |
| 6,303,481 B2 | 10/2001 | Park | 438/591 |
| 6,313,518 B1 | 11/2001 | Ahn et al. | 257/632 |
| 6,337,805 B1 * | 1/2002 | Forbes et al. | 365/145 |
| 6,351,411 B2 | 2/2002 | Forbes et al. | 365/182 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,407,435 B1 | 6/2002 | Ma et al. | 257/411 |
| 6,432,779 B1 | 8/2002 | Hobbs et al. | 438/287 |
| 6,438,031 B1 | 8/2002 | Fastow | 365/185.18 |
| 6,444,039 B1 | 9/2002 | Nguyen | 118/715 |
| 6,444,895 B1 | 9/2002 | Nikawa | 136/212 |
| 6,445,023 B1 | 9/2002 | Vaartstra et al. | 257/295 |
| 6,445,030 B1 | 9/2002 | Wu et al. | 257/315 |
| 6,449,188 B1 | 9/2002 | Fastow | 365/185.18 |
| 6,456,531 B1 | 9/2002 | Wang et al. | 365/185.18 |
| 6,456,536 B1 | 9/2002 | Sobek et al. | 365/185.28 |
| 6,458,701 B1 | 10/2002 | Chae et al. | 438/680 |
| 6,459,618 B1 | 10/2002 | Wang | 365/185.18 |
| 6,465,334 B1 | 10/2002 | Buynoski et al. | 438/591 |
| 6,487,121 B1 | 11/2002 | Thurgate et al. | 365/185.18 |
| 6,495,436 B2 | 12/2002 | Ahn et al. | 438/591 |
| 6,498,362 B1 | 12/2002 | Forbes et al. | 257/295 |
| 6,514,828 B2 | 2/2003 | Ahn et al. | 438/297 |
| 6,521,911 B2 | 2/2003 | Parsons et al. | 257/52 |
| 6,521,958 B1 | 2/2003 | Forbes et al. | 257/391 |
| 6,534,420 B2 | 3/2003 | Ahn et al. | 438/768 |
| 6,545,314 B2 | 4/2003 | Forbes et al. | |
| 6,552,387 B1 | 4/2003 | Eitan | 257/324 |
| 6,559,014 B1 | 5/2003 | Jeon | 438/287 |
| 6,567,303 B1 | 5/2003 | Hamilton et al. | 365/185.03 |
| 6,567,312 B1 | 5/2003 | Torii et al. | 365/185.28 |
| 6,570,787 B1 | 5/2003 | Wang et al. | 365/185.17 |
| 6,580,124 B1 | 6/2003 | Cleeves et al. | 257/331 |
| 6,586,785 B2 | 7/2003 | Flagan et al. | 257/261 |
| 2002/0027264 A1 | 3/2002 | Forbes et al. | 257/662 |
| 2002/0036939 A1 | 3/2002 | Tsai et al. | 365/201 |
| 2002/0074565 A1 | 6/2002 | Flagan et al. | 257/200 |
| 2002/0109158 A1 | 8/2002 | Forbes et al | 257/224 |
| 2002/0155688 A1 | 10/2002 | Ahn et al. | 438/592 |
| 2002/0155689 A1 | 10/2002 | Ahn et al. | 29/76 |
| 2002/0192974 A1 | 12/2002 | Ahn et al. | 438/722 |
| 2003/0017717 A1 | 1/2003 | Ahn et al. | 438/768 |

OTHER PUBLICATIONS

Adelmann, C , et al., "Atomic–layer epitaxy of GaN quantum wells and quantum dots on (0001) AlN", *Journal of Applied Physics, 91(8)*, (Apr. 15, 2002),5498–5500.

Ahn, Seong–Deok , et al., "Surface Morphology Improvement of Metalorganic Chemical Vapor Deposition Al Films by Layered Deposition of Al and Ultrathin TiN", *Japanese Journal of Applied Physics, Part 1 (Regular Papers, Short Notes & Review Papers), 39(6A)*, (Jun. 2000),3349–3354.

Akasaki, I. , "Effects of AlN Buffer Layer on Crystallographic Structure and on Electrical and Optical Properties of GaN and Ga(1–x)Al(x)N [0> x (< or =) 0.4] Films Grown on Sapphire Substrate by MOVPE", *Journal of Crystal Growth, 98*, (1989),209–219.

Alen, Petra , et al., "Atomic LAyer Deposition of Ta(Al)N(C) Thin Films Using Trimethylaluminum as a Reducing Agent", *Journal of the Electrochemical Society, 148(10)*, (Oct. 2001),G566–G571.

Asari, K , et al., "Multi–mode and multi–level technologies for FeRAM embedded reconfigurable hardware", *Solid–State Circuits Conference, 1999. Digest of Technical Papers. ISSCC. 1999 IEEE International* , Feb. 15–17, 1999, (1999), 106–107.

Benjamin, M. , "UV Photoemission Study of Heteroepitaxial AlGaN Films Grown on 6H–SiC", *Applied Surface Science, 104/105*, (Sep. 1996),455–460.

Bermudez, V. , "The Growth and Properties of Al and AlN Films on GaN(0001)–(1×1)", *Journal of Applied Physics, 79(1)*, (Jan. 1996),110–119.

Britton, J , et al., "Metal–nitride–oxide IC memory retains data for meter reader", *Electronics, 45(22)*, (Oct. 23, 1972), 119–23.

Chae, Junghun , et al., "Atomic Layer Deposition of Nickel by the Reduction of Preformed Nickel Oxide", *Electrochemical & Solid–State Letters, 5(6)*, (Jun. 2002),C64–C66.

Chaitsak, Suticai , et al., "Cu(InGa)Se/sub 2/ thin–film solar cells with high resistivity ZnO buffer layers deposited by atomic layer deposition", *Japanese Journal of Applied Physics Part 1–Regular Papers Short Notes & Review Papers, 38(9A)*, (Sep. 1999),4989–4992.

Cricchi, J R., et al., "Hardened MNOS/SOS electrically reprogrammable nonvolatile memory", *IEEE Transactions on Nuclear Science, 24(6)*, (Dec. 1997),2185–9.

Dimaria, D J., "Graded or stepped energy band–gap–insulator MIS structures (GI–MIS or SI–MIS)", *Journal of Applied Physics, 50(9)*, (Sep. 1979),5826–5829.

Dipert, Brian , "Flash Memory Goes Mainstream", *IEEE Spectrum, 30(10)*, (Oct. 1993),48–52.

Eitan, Boaz , "NROM: A Novel Localized Trapping, 2–Bit Nonvolatile Memory Cell", *IEEE Electron Device Letters, 21(ll)*, (Nov. 2000),543–545.

Elam, J W., "Kinetics of the WF6 and Si2H6 surface reactions during tungsten atomic layer deposition", *Surface Science, 479(1–3)*, (May 2001),121–135.

Ferris–Prabhu, A V., "Amnesia in layered insulator FET memory devices", *Institution of Electrical Engineers*, (2002),Abstract.

Ferris–Prabhu, A V., "Charge transfer in layered insulators", *Institution of Electrical Engineers*, (2002),Abstract.

Ferris–Prabhu, A V., "Tunneling theories of non–volatile semiconductor memories", *Physics Status Solidi A, 35(1)*, (May 16, 1976),243–50.

Fisch, D E., et al., "Analysis of thin film ferroelectric aging", *Proc. IEEE Int. Reliability Physics Symp.*, (1990),237–242.

Forbes, L., et al., "Field Induced Re–Emission of Electrons Trapped in SiO", *IEEE Transactions on Electron Devices, ED–26 (11)*, Briefs,(Nov. 1979),1816–1818.

Forsgren, Katarina, "Atomic Layer Deposition of HfO2 using hafnium iodide", *Conference held in Monterey, California*, (May 2001),1 page.

Frohman–Bentchkowsky, D, "An integrated metal–nitride–oxide–silicon (MNOS) memory", *Proceeds of the IEEE, 57(6)*, (Jun. 1969),1190–1192.

Goodwins, Rupert, "New Memory Technologies on the Way", http://zdnet.com.com/2100–1103–846950.html, (Feb. 2002).

Guha, S, et al., "Atomic beam deposition of lanthanum–and yttrium–based oxide thin films for gate dielectrics", *Appl. Phys. Lett., 77*, (2000),2710–2712.

Hwang, C G., "Semiconductor Memories for the IT Era", *2002 IEEE International Solid–State Circuits Conference, Digest of Technical Papers IEEE*, Part vol. 1, San Francisco, (2002),24–27.

Hwang, N., et al., "Tunneling and Thermal Emission of Electrons from a Distribution of Deep Traps in SiO", *IEEE Transactions on Electron Devices, 40(6)*, (Jun. 1993),1100–1103.

Juppo, Marika, et al., "Use of 1,1Dimethylhydrazine in the Atomic Layer Deposition of Transition Metal Nitride Thin Films", *Journal of the Electrochemical Society, 147(9)*, (Sep. 2000),3377–3381.

Klaus, J W., et al., "Atomic layer deposition of tungsten nitride films using sequential surface reactions", *Journal of the Electrochemical Society, 147(3)*, (Mar. 2000),1175–81.

Koo, J, "Study on the characteristics of TiAlN thin film deposited by atomic layer deposition method", *Journal of Vacuum Science & Technology A–Vacuum Surfaces & Films, 19(6)*, (Nov. 2001),2831–4.

Lei, T., "Epitaxial Growth and Characterization of Zinc–Blende Gallium Nitride on (001) Silicon", *Journal of Applied Physics, 71(10)*, (May 1992),4933–4943.

Luan, H., "High Quality Ta2O5 Gate Dielectrics with Tox,eq<10A", *IEDM*, (1999),pp. 141–144.

Lusky, et al., "Characterization of channel hot electron injection by the subthreshold slope of NROM/sup TM/ device", *IEEE Electron Device Letters, vol. 22, No. 11*, (Nov. 2001),556–558.

Maayan, Eduardo, et al., "A 512Mb NROM Flash Data Storage Memory with 8MB/s Data Rate", *Solid–State Circuits Conference, 2002. Digest of Technical Papers. ISSCC*, (2002),100–101.

Marlid, Bjorn, et al., "Atomic layer deposition of BN thin films", *Thin Solid Films, 402(1–2)*, (Jan. 2002),167–171.

Min, Jae–Sik, et al., "Atomic layer deposition of TiN films by alternate supply of tetrakis (ethylmethylamino)–titanium and ammonia", *Japanese Journal of Applied Physics Part 1–Regular Papers Short Notes & Review Papers, vol. 37, No. 9A*, (Sep. 1998),4999–5004.

Min, J., "Metal–organic atomic–layer deposition of titanium–silicon–nitride films", *Applied Physics Letters, 75(11)*, (1999),1521–1523.

Moazzami, R, "Endurance properties of Ferroelectric PZT thin films", *Int. Electron Devices Mtg.*, San Francisco, (1990),417–20.

Moazzami, R, "Ferroelectric PZT thin films for semiconductor memory", *Ph.D Thesis, University of California, Berkeley*, (1991), Molnar, R., "Growth of Gallium Nitride by Electron–Cyclotron Resonance Plasma–Assisted Molecular–Beam Epitaxy: The Role of Charged Species", *Journal of Applied Physics, 76(8)*, (Oct. 1994),4587–4595.

Moriwaki, M, "Improved metal gate process by simultaneous gate–oxide nitridation during W/WN/sub x/gate formation", *Japanese Journal of Applied Physics Part 1–Regular Papers Short Notes & Review Papers, 39(4B)*, (Apr. 2000),2177–2180.

Nakajima, Anri, "Soft breakdown free atomic–layer–deposited silicon–nitride/SiO/sub 2/ stack gate dielectrics", *International Electron Devices Meeting. Technical Digest*, (2001),6.5.1–4.

Pankove, J., "Photoemission from GaN", *Applied Physics Letters, 25*, (1974),53–55.

Papadas, C., "Modeling of the Intrinsic Retention Charcteristics of FLOTOX EEPROM Cells Under Elevated Temperature Conditions", *IEEE Transaction on Electron Devices, 42*, (Apr. 1995),678–682.

Park, Jin–Seong, et al., "Plasma–Enhanced Atomic Layer Deposition of Tantalum Nitrides Using Hydrogen Radicals as a Reducing Agent", *Electrochemical & Solid–State Letters, 4(4)*, (Apr. 2001),C17–19.

Puurunen, R L., et al., "Growth of aluminum nitride on porous silica by atomic layer chemical vapour deposition", *Applied Surface Science, 165(2–3)*, (Sep. 12, 2000),193–202.

Robertson, J., "Band offsets of wide–band–gap oxides and implications for future electronic devices", *Journal of Vacuum Science & Technology B (Microelectronics and Nanometer Structures), 18(3)*, (May–Jun 2000),1785–1791.

Sanders, B W., et al., "Zinc Oxysulfide Thin Films Grown by Atomic Layer Deposition", *Chemistry of Materials, 4(5)*, (1992),1005–1011.

She, Min, et al., "Modeling and design study of nanocrystal memory devices", *IEEE Device Research Conference*, (2001),139–40.

Shimada, H, et al., "Tantalum nitride metal gate FD–SOI CMOS FETs using low resistivity self–grown bcc–tantalum layer", *IEEE Transactions on Electron Devices, vol. 48, No. 8*, (Aug. 200),1619–1626.

Shirota, R, et al., "A 2.3 mu m/sup 2/ memory cell structure for 16 Mb NAND EEPROMs", *International Electron Devices Meeting 1990. Technical Digest*, San Francisco, (1990),103–106.

Solanki, Raj, et al., "Atomic Layer Deposition of Copper Seed Layers", *Electrochemical & Solid–State Letters, 3(10)*, (Oct. 2000),479–480.

Sze, S M., "Physics of Semiconductor Devices", *New York: Wiley*, (1981),504–506.

Wei, L S., et al., "Trapping, emission and generation in MNOS memory devices", *Solid–State Electronics, 17(6)*, (Jun. 1974),591–8.

White, M H., et al., "Characterization of thin–oxide MNOS memory transistors", *IEEE Transactions on Electron Devices, ED–19(12)*, (Dec. 1972),1280–1288.

White, M H., "Direct tunneling in metal–nitride–oxide–silicon (MNOS) structures", *Programmme of the 31st physical electronics conference*, (1971),1.

Wilk, G. D., et al., "High–K gate dielectrics: Current status and materials properties considerations", *Journal of Applied Physics, 89(10)*, (2001),5243–5275.

Wood, S W., "Ferroelectric memory design", *M.A.Sc. thesis, University of Toronto*, (1992).

Yagashita, A , "Dynamic threshold voltage damascene metal gate MOSFET (DT–DMG–MOS) with low threshold voltage, high drive current and uniform electrical characteristics", *International Electron Devices Meeting 2000. Technical Digest. IEDM*, (Dec. 2000),663–666.

Yoder, M , "Wide Bandgap Semiconductor Materials and Devices", *IEEE Transactions on Electron Devices, 43*, (Oct. 1996),1633–1636.

Zhu, W J., et al., "Current transport in metal/hafnium oxide/silicon structure", *IEEE Electron Device Letters, 23*, (2002),97–99.

Zhu, W , et al., "HfO2 and HfAlO for CMOS: Thermal Stability and Current Tranport", *IEEE International Electron Device Meeting 2001*, (2001),463–466.

\* cited by examiner

FERROELECTRIC WRITE ONCE READ ONLY MEMORY FOR ARCHIVAL STORAGE

CROSS REFERENCE TO RELATED APPLICATIONS

This application is a Continuation of U.S. application Ser. No. 10/177,082 filed Jun. 21, 2002 which is incorporated herein by reference.

This application is related to the following co-pending, commonly assigned U.S. patent applications: "Write Once Read Only Memory Employing Charge Trapping in Insulators," Ser. No. 10/177,077, "Write Once Read Only Memory Employing Floating Gates," Ser. No. 10/177,083, "Nanocrystal Write Once Read Only Memory for Archival Storage," Ser. No. 10/177,214, "Write Once Read Only Memory with Large Work Function Floating Gates," Ser. No. 10/177,213, "Vertical NROM Having a Storage Density of 1 Bit per $1F^2$," Ser. No. 10/177,208, and "Multistate NROM Having a Storage Density Much Greater than 1 Bit per $1F^2$," Ser. No. 10/177,211, of which disclosure is herein incorporated by reference.

FIELD OF THE INVENTION

The present invention relates generally to semiconductor integrated circuits and, more particularly, to ferroelectric write once read only memory for archival storage.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell. Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

Dynamic random access memories (DRAMs) are the most cost-effective, high-speed memory used with present day computers. DRAMS last nearly indefinitely. Moreover, DRAMs are available in very high density configurations, e.g., 64 megabytes (MB). However, DRAMS can only store information for a limited time without constant refreshing and lose all knowledge of their state once power is removed.

Ferroelectric capacitors are currently being used as nonvolatile memory devices, as disclosed in U.S. Pat. No. 4,888,733, which is entitled "Nonvolatile Memory Cell and Sensing Method" and discloses a two transistor, one capacitor (2T/1C) memory cell. In addition, ferroelectric capacitors are often employed in nonvolatile random access memories (NVRAMs). Memory cells having structures approximating that of DRAMs, i.e., arranged in the conventional one transistor, one capacitor (1T/1C) memory cell pattern, are disclosed in U.S. Pat. No. 5,600,587 (Ferroelectric Random Access Memory), U.S. Pat. No. 5,572,459 (Voltage Reference for a Ferroelectric 1T/1C Based Memory), U.S. Pat. No. 5,550,770 (Semiconductor Memory Device Having FE Capacitor Memory Cells with Reading, Writing, and Forced Refreshing Functions and a Method of Operating the Same), U.S. Pat. No. 5,530,668 (Ferroelectric Memory Sensing Scheme Using Bit Lines Precharged to a Logic One Voltage), and U.S. Pat. No. 5,541,872 (Folded Bit Line Ferroelectric Memory Device). It should be mentioned that all of the patents cited above are incorporated by reference herein for all purposes.

In the above-mentioned patents, the capacitor in a 1T/1C DRAM structure is replaced by a ferroelectric capacitor, as illustrated in FIG. 1A. The memory cell 1 of FIG. 1A includes a wordline 10, a digitline 12, a transistor 14 and a ferroelectric capacitor 16. In operation, the remnant charges are detected on a bit line in a manner similar to the operation of a conventional DRAM. However, these structures are not without attendant problems.

There is an extensive body of literature on both the electrical characteristics of ferroelectric capacitors and applications in cells similar to conventional DRAMs, except that these cells are classified as nonvolatile RAMs (NVRAMs) instead of DRAMs. One recent publication by K. Asaril et al., entitled "Multi-Level Technologies for FRAM Embedded Reconfigurable Hardware" (IEEE Int. Solid-State Circuits Conf., San Francisco 1999, pp. 108–109), describes the use of a ferroelectric capacitor in a ferroelectric RAM (FRAM)which is employed with low voltage to store and access RAM data superimposed on less-frequently accessed read-only memory (ROM) data in the same cell. See U.S. Pat. No. 5,539,279, entitled "Ferroelectric Memory." The RAM data is volatile and needs to be refreshed on a regular basis, or this aspect of the cell acts like a DRAM. The electrically alterable read-only memory (EAROM), e.g., an electrically erasable programmable ROM (EEPROM) data is nonvolatile. In other words, the FRAM acts like a DRAM with a "repressed" nonvolatile read only "memory," or "repressed memory."

Other applications use the ferroelectric capacitors as part of a stacked gate structure similar not to DRAMs but rather to EEPROM or flash memory devices. See, for example, U.S. Pat. No. 5,541,871 ("Nonvolatile Ferroelectric Semiconductor Memory") and U.S. Pat. No. 5,856,688 ("Integrated Circuit Memory Devices Having Nonvolatile Single Transistor Unit Cells Therein"), which patents are also incorporated herein by reference for all purposes. It will be appreciated that in these devices, however, the remnant charge or polarization charge of the ferroelectric element is used to store information rather than electrons injected onto or removed from a floating gate by hot electron effects and/or tunneling. Instead, the charge differences are not differences in the number of electrons trapped on the gate but rather the polarization charge of the upper ferroelectric capacitor.

It should also be mentioned that the prior art referenced in U.S. Pat. No. 5,541,871 describes a basic structure consisting of a ferroelectric capacitor in series with a gate capacitance, which are both planar structures. As shown in FIG. 1B, a memory cell 1' includes a wordline 10, a digitline 12, a transistor 14, and a ferroelectric capacitor 20, one plate of the ferroelectric capacitor forming the gate of the transistor 14.

FIG. 1C illustrates a memory cell 1", which includes the wordline 10, digitline 12, transistor 14, a high dielectric capacitor 30 and a ferroelectric capacitor 32. It will be noted that the lower plate of capacitor 30 is the channel of the transistor 14.

The problem with the above disclosed structure is that the ferroelectric elements have very high electric relative permittivities as, for instance, 80 and 150. It will be appreciated that these permittivity values are 20 to 40 times higher than that of silicon dioxide. It will also be appreciated that, if comparable thicknesses of materials as are used in constructing the ferroelectric and conventional capacitors, only a small fraction, e.g., 2% to 5%, of the voltage applied across the series capacitors will appear across the ferroelectric capacitor. Thus, if the ferroelectric capacitor has a coercive voltage, Vc, i.e., the voltage required for programming, of 1 V or 3 V, then the total word line voltage required for programming the memory cell will be on the order 20 V to 150 V. It will be noted that these are far in excess of voltages used on current CMOS-integrated circuits.

U.S. Pat. No. 5,856,688 seeks to solve this problem by using a "C" shaped floating gate and two control gates. One control gate is a plate of the ferroelectric capacitor and the other control gate is a plate of another capacitor fabricated using a high dielectric constant material. The two capacitors in series, one with a high dielectric constant ferroelectric and the other with a high dielectric constant insulator, are used to program the ferroelectric capacitor at lower voltages. Since the capacitances are more or less comparable, the programming voltage will divide more equally, resulting in a significant fraction across the ferroelectric capacitor.

It should be mentioned that other repressed memory devices have been proposed. For example, a repressed memory where the NVRAM function is provided by a flash memory type structure for the gate of the transfer device is described in the commonly assigned, copending application entitled "DRAM AND SRAM MEMORY CELLS WITH REPRESSED MEMORY" (Ser. No. (09/362,909, filed Jul. 29, 1999), which application is incorporated herein by reference for all purposes. It will be appreciated that these memories do not function like the shadow RAM disclosed in U.S. Pat. 5,399,516 ("Method of Making a Shadow Ram Cell Having a Shallow Trench EEPROM"), storing the same information on both memory planes.

In contrast, U.S. application Ser. No. 09/385,380, describes a memory cell 1''' having first and second operating modes. The memory cell 1''' includes a charge transfer transistor 14 having a gate adjacent to a channel region coupling source and drain regions, a digitline 12 coupled to one of the source and drain regions, a storage capacitor 16 coupled to the other of the source and drain regions, a ferroelectric capacitor 32, and a wordline 10 coupled to the gate by the ferroelectric capacitor 32. The polysilicon vertical interconnect connecting the ferroelectric capacitor 32 with oxide layer covering the gate of the transistor 14 forms an intrinsic capacitor 30. (See FIG. 1D). Data is written to and read out of the storage capacitor during the first operating mode, i.e., a normal DRAM access speeds, and written to and read out of the ferroelectric capacitor during the second mode of operation, i.e., at speeds several times slower than normal DRAM access speeds.

It would be very desirable if a memory cell or device could be developed with all of the positive features of DRAMS, i.e., cost, size, speed, availability, etc., which also is nonvolatile, i.e., maintains its memory state with power removed. It would be highly desirable to have a memory element and corresponding system that functions at speeds comparable to that of today's DRAMs. It would also be desirable if at least one logic device could be implemented using a modified form of the memory cell.

With successive generations of DRAM chips, an emphasis continues to be placed on increasing array density and maximizing chip real estate while minimizing the cost of manufacture. It is further desirable to increase array density with little or no modification of the DRAM optimized process flow.

A requirement exists for memory devices which need only be programmed once, as for instance to function as an electronic film in a camera. If the memory arrays have a very high density then they can store a large number of very high resolution images in a digital camera. If the memory is inexpensive then it can for instance replace the light sensitive films which are used to store images in conventional cameras.

Thus, there is a need for improved DRAM technology compatible write once read only memory. It is desirable that such write once read only memory be fabricated on a DRAM chip with little or no modification of the DRAM process flow. It is further desirable that such write once read only memory operate with lower programming voltages than that used by conventional DRAM cells, yet still hold sufficient charge to withstand the effects of parasitic capacitances and noise due to circuit operation.

SUMMARY OF THE INVENTION

The above mentioned problems for creating DRAM technology compatible write once read only memory cells as well as other problems are addressed by the present invention and will be understood by reading and studying the following specification. This disclosure teaches structures and methods using transistor devices as write once read only memory in a DRAM integrated circuit. The structures and methods use the existing process sequence for MOSFET's in DRAM technology.

In particular, an illustrative embodiment of the present invention includes a write once read only memory cell. The write once read only memory cell includes a charge amplifier transistor. The transistor has a first source/drain region, a second source/drain region, and a channel region between the first and the second source/drain regions. A gate stack is located above the channel region. The gate stack includes; a gate oxide layer, a polysilicon interconnect on the gate oxide, a ferroelectric dielectric coupled to the polysilicon interconnect, and a control electrode coupled to the ferroelectric dielectric. A plug is coupled to the first source/drain region and couples the first source/drain region to an array plate. A transmission line is coupled to the second source/ drain region. According to the teachings of the present invention, the transistor is adapted to be programmed, storing information in the ferroelectric dielectric of the gate stack, such that the programmed transistor operates at a reduced drain source current for long retention archival storage.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
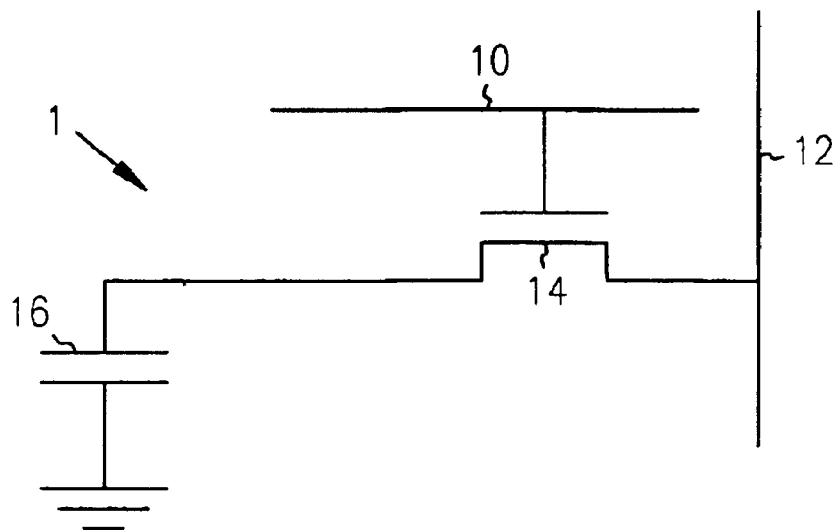
FIGS. 1A–1D illustrate a number of ferroelectric memory type devices according to the teachings of the prior art.
Figure 1B:
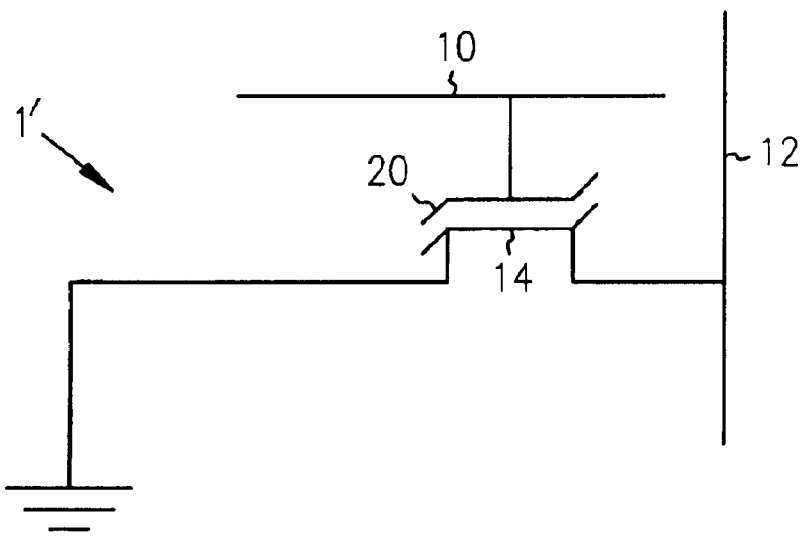
Figure 1C:
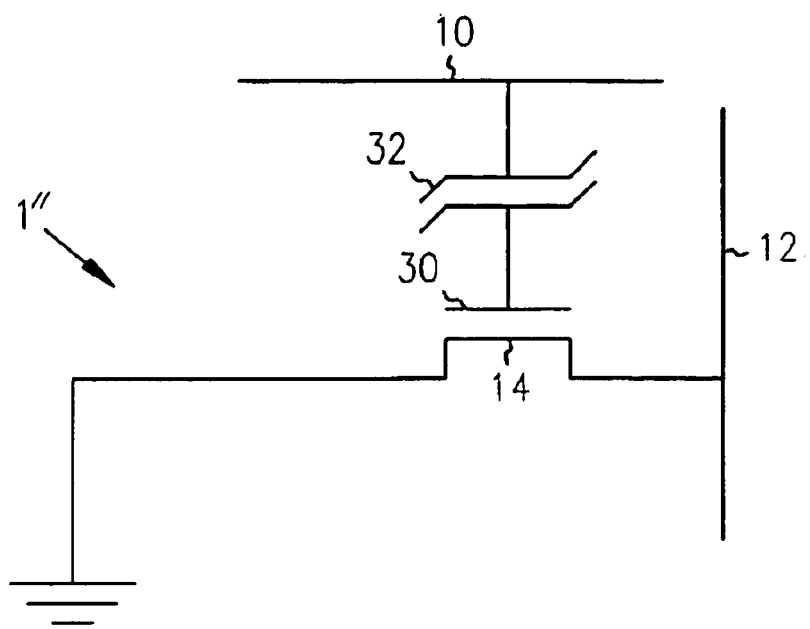
Figure 1D:
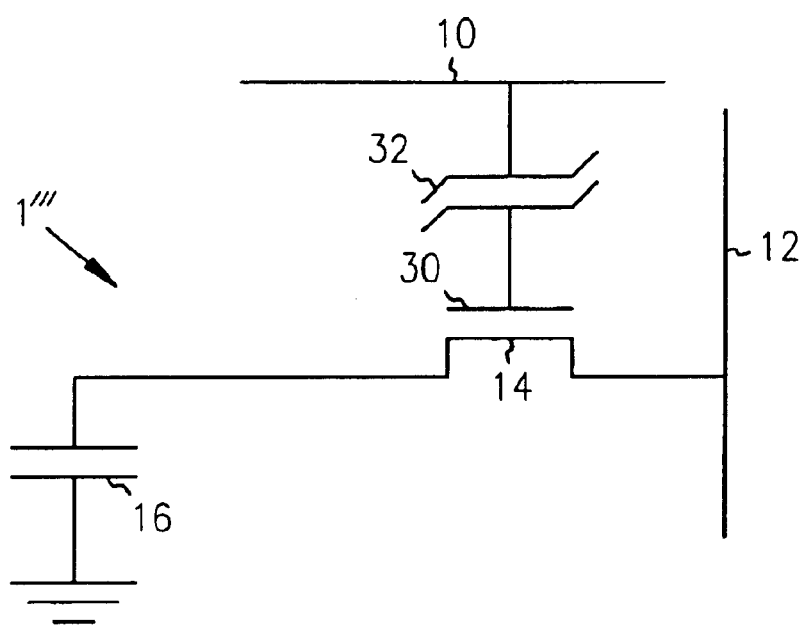

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

In the above cross referenced related applications, filed on even date herewith by the same inventor, the author of the present invention describes the use of insulator trapping, floating gates, floating gates with large work functions, nanocrystal particles for write-once-read-only memories. These devices were employed in DRAM like arrays except there are not storage capacitors. The use of the DRAM like arrays allows comparison of the memory cell to a dummy cell and a very sensitive sense amplifier to detect small charge differences in the gate structures of the transistors in the arrays.

The author of the present invention has also previously described the use of very high dielectric constant ferroelectric materials in the gate structures of MOSFET transistors using edge defined structures. (See generally, L. Forbes, K. Y. Ahn, W. Noble and A. Reinberg, "DRAM MEMORY CELL WITH REPRESSED FERROELECTRIC MEMORY," U.S. Pat. No. 6,141,238, issued Oct. 31, 2000; and L. Forbes, K. Y. Ahn and W. Noble, "DISCRETE DEVICES INCLUDING EAPROM TRANSISTOR AND NVRAM MEMORY CELL WITH EDGE DEFINED FERROELECTRIC CAPACITANCE," U.S. Pat. No. 6,337,805, issued Jan. 8, 2002).

The author of the present invention has also previously described the use of lower dielectric constant and/or weak ferroelectric materials and fabrication techniques for use in conventional planar gate structures of MOSFET transistors. (See generally, L. Forbes and K. Y. Ahn, "WEAK FERROELECTRIC MEMORY TRANSISTOR," U.S. patent application Ser. No. 09/383,726; K. Y. Ahn and L. Forbes, "FERROELECTRIC MEMORY TRANSISTOR WITH HIGH-K GATE INSULATOR AND METHOD OF FABRICATION," U.S. patent application Ser. No. 09/594,817; K. Y. Ahn and L. Forbes, "FERROELECTRIC MEMORY TRANSISTOR WITH ATOMIC-LAYER-DEPOSITED HIGH-K GATE INSULATOR AND METHOD OF LOW-TEMPERATURE FABRICATION," U.S. patent application Ser. No. 09/809,560; K. Y. Ahn and L. Forbes, "A NOVEL METHOD AND APPARATUS FOR FABRICATION OF WEAK FERROELECTRIC FILMS," U.S. patent application Ser. No. 09/810,368. Each of these references is incorporated herein in full for all purposes.

The present invention, however, discloses the use of ferroelectric materials, as identified in the above references, in gate stack structures for write once read only memory. That is, the gate stack structures of the present invention are combined with the use of a modification of DRAM array structures, as disclosed for other cell types in the above cross referenced related applications, to form novel ferroelectric write once read only memory cells, arrays and systems.

Figure 2A:
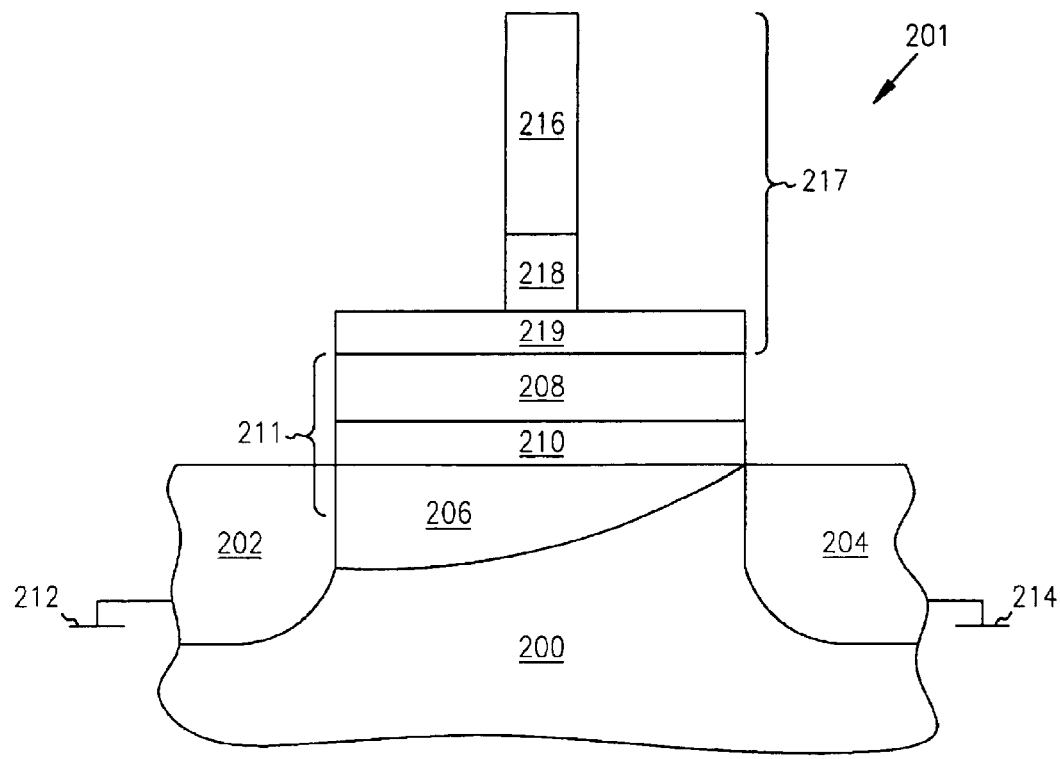
FIG. 2A illustrates an edge defined high dielectric constant ferroelectric gate capacitor structure according to the teachings of the present invention.

FIG. 2A illustrates an edge defined high dielectric constant ferroelectric gate capacitor structure which can be used as a write once read only memory cell according to the teachings of the present invention. As shown in the embodiment of FIG. 2A the write once read only memory cell 201 includes a first source/drain region 202, a second source/drain region 204, and a channel region 206 between the first and second source/drain regions, 202 and 204 in a substrate 200. In one embodiment, the first source/drain region 202 includes a source region 202 and the second source/drain region 204 includes a drain region 204. FIG. 2A further illustrates a gate 208 separated from the channel region 206 by a gate dielectric 210. In one embodiment according to the teachings of the present invention, the gate 208 includes a polysilicon gate 208. In one embodiment, the gate dielectric 210 includes a gate oxide 210. This structure (202, 204, 206, 208, 210) forms a charge amplifier transistor. According to the teachings of the present invention, the charge amplifier transistor includes a CMOS transistor 211 formed according to a modified dynamic random access memory (DRAM) fabrication process. The transistor includes a capacitor 211 formed by the channel region 206, the gate dielectric 210 and the gate 208.

As shown in FIG. 2A, an edge defined ferroelectric dielectric 218 is coupled to the gate electrode 208, or polysilicon gate 208, of the charge amplifier transistor. As shown in FIG. 2A, the edge defined ferroelectric dielectric 218 is in a stacked alignment with an active region, e.g. channel 206, of the transistor. In the embodiment of FIG. 2A, a layer of platinum (Pt) material 219 is located between the edge defined ferroelectric dielectric 218 and the polysilicon gate 208. An edge defined control electrode 216 is coupled to the edge defined ferroelectric dielectric 218. The control electrode 216 serves as a control gate 216. In one embodiment, the control electrode 216 includes a control electrode formed of platinum (Pt). The control gate 216, the ferroelectric dielectric 218, and the platinum material 219 form a capacitor 217.

An array plate 212 is coupled to the first source/drain region 202 and a transmission line 214 is coupled to the second source/drain region 204. In one embodiment, the transmission line 214 includes a bit line 214.

Figure 2B:
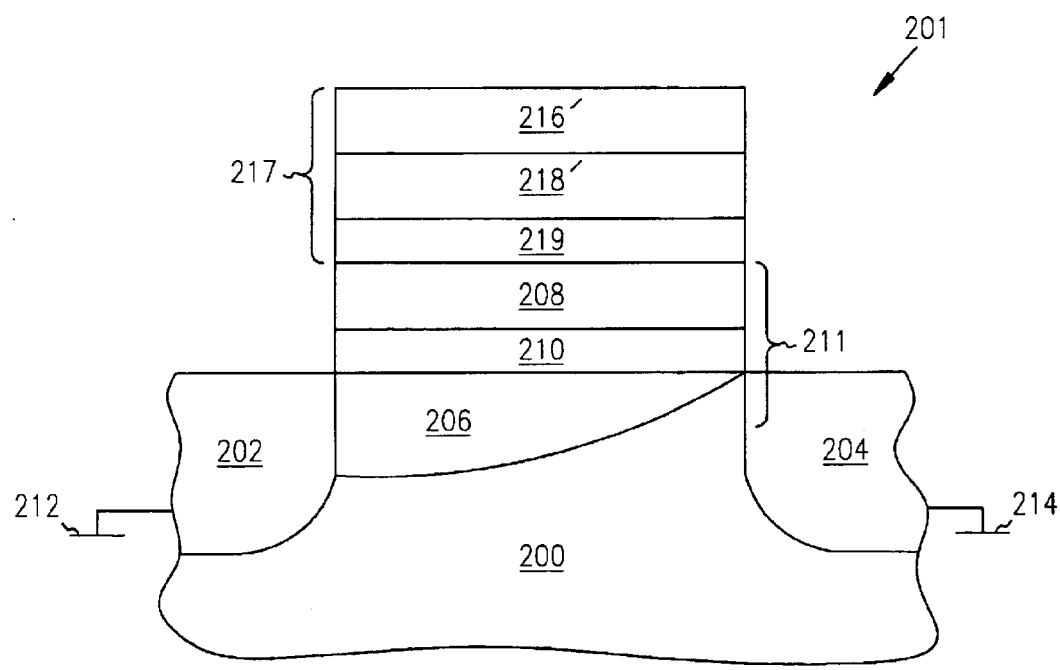
FIG. 2B illustrates a weak ferroelectric material in a planar gate stack structure according to the teachings of the present invention.

FIG. 2B illustrates a weak ferroelectric material in a planar gate stack structure which can be used as a write once read only memory cell according to the teachings of the present invention. As shown in the embodiment of FIG. 2B, the write once read only memory cell 201 includes a first source/drain region 202, a second source/drain region 204, and a channel region 206 between the first and second source/drain regions, 202 and 204 in a substrate 200. In one embodiment, the first source/drain region 202 includes a source region 202 and the second source/drain region 204 includes a drain region 204. FIG. 2B further illustrates a gate 208 separated from the channel region 206 by a gate dielectric 210. In one embodiment according to the teachings of the present invention, the gate 208 includes a polysilicon gate 208. In one embodiment, the gate dielectric 210 includes a gate oxide 210. This structure (202, 204, 206, 208, 210) forms a charge amplifier transistor. According to the teachings of the present invention, the charge amplifier transistor includes a CMOS transistor formed according to a modified dynamic random access memory (DRAM) fabrication process. The transistor includes a capacitor 211 formed by the channel region 206, the gate dielectric 210 and the gate 208.

As shown in FIG. 2B, a ferroelectric dielectric 218' is coupled to the gate electrode 208, or polysilicon gate 208, of the charge amplifier transistor. In the embodiment of FIG. 2B, a layer of platinum (Pt) material 219 is located between the ferroelectric dielectric 218' and the polysilicon gate 208 to improve the electrical interconnect properties, however, the invention is not so limited. A control electrode 216' is coupled to the ferroelectric dielectric 218'. The control electrode 216' serves as a control gate 216'. In one embodiment, the control electrode 216' includes a control electrode formed of platinum (Pt). It is noted that the control electrode 216' of the present invention is not limited to a platinum electrode and one of ordinary skill in the art will appreciate upon reading this disclosure that other suitable materials for achieving the operation of the invention are considered within the scope of this disclosure. The control gate 216, the ferroelectric dielectric 218, and the platinum material 219 form a capacitor 217.

As with the embodiment of FIG. 2A, an array plate 212 is coupled to the first source/drain region 202 and a transmission line 214 is coupled to the second source/drain region 204. In one embodiment, the transmission line 214 includes a bit line 214.

According to the teachings of the present invention, the ferroelectric dielectric 218 has a built in dipole charge. And thus, according to the teachings of the present invention and as described in more detail below, the ferroelectric write once read only memory cell of the present invention is adapted to be programmed, storing information in the ferroelectric dielectric 218 of the gate stack, such that the programmed cell, or transistor, operates at a reduced drain source current for long retention archival storage.

Figure 3:
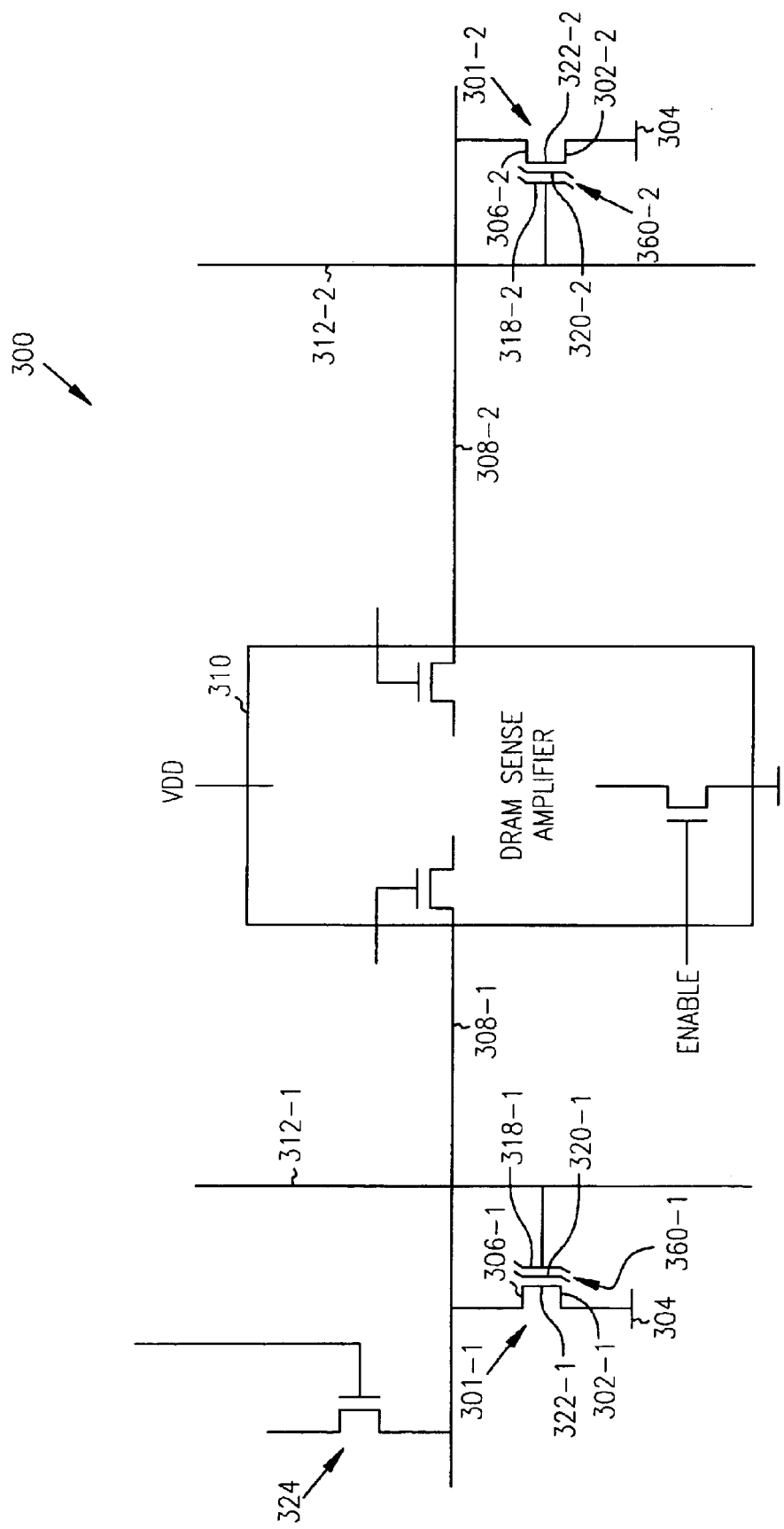
FIG. 3 illustrates a portion of a memory array, including a ferroelectric write once read only memory according to the teachings of the present invention.

FIG. 3 illustrates a portion of a memory array 300 according to the teachings of the present invention. The memory in FIG. 3, is shown illustrating a pair of ferroelectric write once read only memory cells 301-1 and 301-2 formed according to the teachings of the present invention. As one of ordinary skill in the art will understand upon reading this disclosure, any number of ferroelectric write once and read only memory cells can be organized in an array, but for ease of illustration only two are displayed in FIG. 3. As shown in FIG. 3, a first source/drain region, 302-1 and 302-2 respectively, is coupled to an array plate 304. A second source/drain region, 306-1 and 306-2 respectively, is coupled to a transmission line, or bitline, 308-1 and 308-2 respectively. Each of the bitlines, 308-1 and 308-2, couple to a sense amplifier, shown generally at 310. A wordline, 312-1 and 312-2 respectively, is couple to a control gate, 318-1 and 318-2 respectively, for each of the ferroelectric write once read only memory cells, 301-1 and 301-2. According to the teachings of the present invention and as described above, the ferroelectric write once read only memory cells, 301-1 and 301-2 include a gate stack located above a channel region, 322-1 and 322-2. The gate stack includes two capacitors in series. A first capacitor is formed between the channel region, 322-1 and 322-2 and a transistor gate, 320-1 and 320-2 respectively, which are separated by a gate oxide as the dielectric material. A second capacitor is formed between the transistor gate, 320-1 and 320-2, and the control gate, 318-1 and 318-2, separated by a ferroelectric dielectric as the dielectric material. As one of ordinary skill in the art will appreciate upon reading this disclosure, the second capacitor includes a built in dipole charge.

As one of ordinary skill in the art will appreciate upon reading this disclosure, the ferroelectric dielectric includes, in some embodiments, a high dielectric constant material. (See generally, L. Forbes, K. Y. Ahn, W. Noble and A. Reinberg, "DRAM MEMORY CELL WITH REPRESSED FERROELECTRIC MEMORY," U.S. Pat. No. 6,141,238, issued Oct. 31, 2000; and L. Forbes, K. Y. Ahn and W. Noble, "DISCRETE DEVICES INCLUDING EAPROM TRANSISTOR AND NVRAM MEMORY CELL WITH EDGE DEFINED FERROELECTRIC CAPACITANCE," U.S. Pat. No. 6,337,805, issued Jan. 8, 2002). And, in some embodiments, the ferroelectric dielectric includes lower dielectric constant and/or weak ferroelectric materials for use in planar gate stack structures of MOSFET transistors. (See generally, L. Forbes and K. Y. Ahn, "WEAK FERROELECTRIC MEMORY TRANSISTOR," U.S. patent application Ser. No. 09/383,726; K. Y. Ahn and L. Forbes, "FERROELECTRIC MEMORY TRANSISTOR WITH HIGH-K GATE INSULATOR AND METHOD OF FABRICATION," U.S. patent application Ser. No. 09/549, 817; K. Y. Ahn and L. Forbes, "FERROELECTRIC MEMORY TRANSISTOR WITH ATOMIC-LAYER-DEPOSITED HIGH-K GATE INSULATOR AND METHOD OF LOW-TEMPERATURE FABRICATION,"

U.S. patent application Ser. No. 09/809,560; K. Y. Ahn and L. Forbes, "A NOVEL METHOD AND APPARATUS FOR FABRICATION OF WEAK FERROELECTRIC FILMS," U.S. patent application Ser. No. 09/810,368. Each of these references is incorporated herein in full for all purposes.

A write data/precharge circuit is shown at 324 for coupling a first or a second potential to transmission line, or bitline 308-1. As one of ordinary skill in the art will understand upon reading this disclosure, the write data/precharge circuit 324 is adapted to couple either a ground to the bitline 308-1 during an erase or reset operation, or alternatively to precharge the bitline 308-1 to fractional voltage of VDD during a write operation. As one of ordinary skill in the art will understand upon reading this disclosure, the array plate 304 can be similarly biased to different voltages. That is, as explained in more detail below, the array plate 304 can be grounded during the erase or reset operation, as well as during a write operation to a selected cell. And, the array plate 304 can be biased to a positive applied voltage for a non-selected cell during the above operations.

As shown in FIG. 3, the array structure 300 has no capacitors. Instead, according to the teachings of the present invention, the first source/drain region or source region, 302-1 and 302-2, are coupled via a conductive plug directly to the array plate 304. In order to write, the array plate 304 and bitline 308-1 are grounded and the wordline 312-1 is biased to voltage higher than VDD. In this manner, the ferroelectric capacitor will become polarized, storing information in therein.

During read, the ferroelectric write once read only memory cell, 301-1 or 301-2, is operated in the forward direction with the array plate 304 grounded and the bit line, 308-1 or 308-2, and respective second source/drain region or drain region, 306-1 and 306-2, of the cells precharged to some fractional voltage of VDD. If the device is addressed by the word line, 312-1 or 312-2, then the "imprint" of information stored in the ferroelectric capacitor dielectric will effect the conductivity of the transistor and will be detected using the sense amplifier 310. In one embodiment, the sense amplifier 310 utilizes an ENABLE signal as indicated in FIG. 3. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as write once read only memory cells in a novel fashion.

In operation the programmed devices, e.g. cell 301-1, can be compared to an unprogrammed reference or dummy device/cell, e.g. 301-2, as shown in FIG. 3. The write and possible erase feature could be used during manufacture and test to initially program all cells or devices to have similar or matching conductivity before use in the field. The sense amplifier 310 can then detect small differences in cell or device characteristics due to the "imprint" of information stored in the ferroelectric capacitor 360-1, 360-2 during the write operation. In this manner, a programmed ferroelectric write once read only memory cell operates at a reduce drain source current.

As one of ordinary skill in the art will understand upon reading this disclosure such arrays of ferroelectric write once read only memory cells are conveniently realized by a modification of DRAM technology. That is, the transfer devices in conventional DRAM arrays are replaced by ferroelectric memory type devices, having both oxide and ferroelectric dielectrics in the gate stack. Conventional transistors for address decode and sense amplifiers can be fabricated after this step with normal thin gate insulators of silicon oxide.

Figure 4:
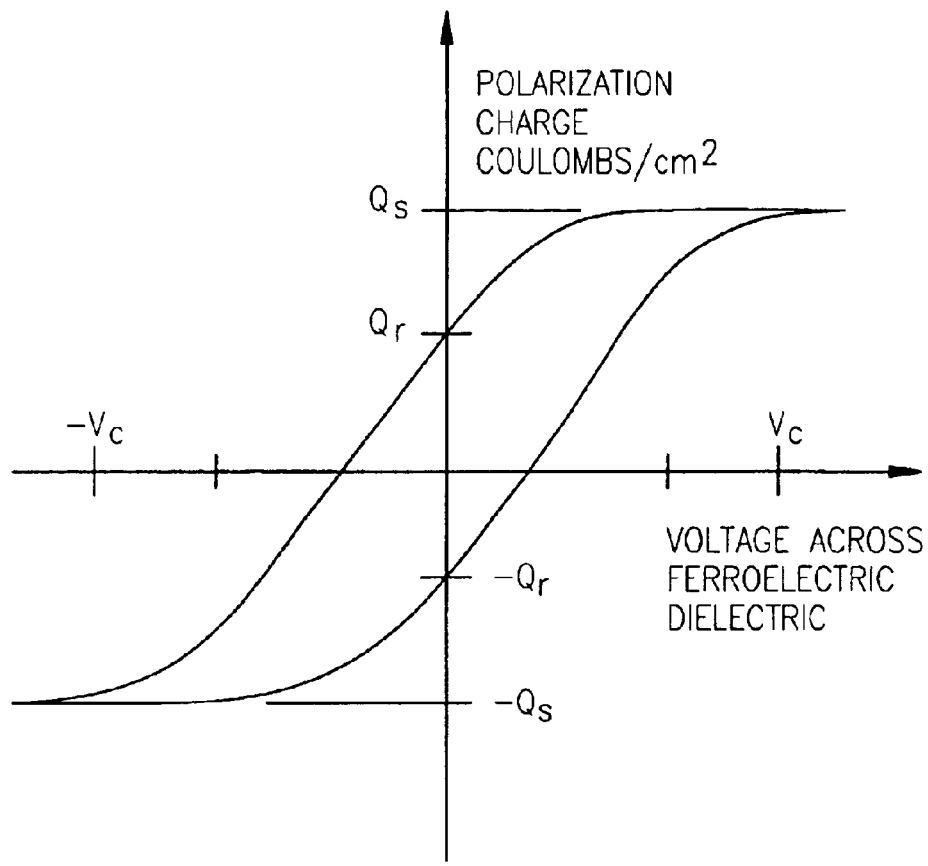
FIG. 4 is a graph plotting polarization charge versus applied voltage across a ferroelectric dielectric which illustrates the characteristics of a ferroelectric capacitor according to the teachings of the present invention.

FIG. 4 is a graph plotting polarization charge versus applied voltage across a ferroelectric dielectric which illustrates the characteristics of a ferroelectric capacitor according to the teachings of the present invention. That is, FIG. 4, is useful as a review of the properties of ferroelectric materials and gives a definition of the terms used to describe their characteristics. Ferroelectric memories have long retention if not recycled repeatedly and not subjected to fatigue. (See generally, R. Moazzami, "Ferroelectric PZT thin films for semiconductor memory," Ph.D. thesis, University of California, Berkeley, 1991; R Moazzami et al., "Endurance properties of Ferroelectric PZT thin films," Int. Electron Devices Mtg., San Francisco, 1990, pp. 417–20). PZT a very high dielectric constant ferroelectric starts to loose polarization stability only after about $10^{12}$ cycles. (See generally, D. E. Fisch et al., "Analysis of thin film ferroelectric aging," Proc. IEEE Int. Reliability Physics Symp., March 1990, pp. 237–242; R. Moazzami, "Ferroelectric PZT thin films for semiconductor memory," Ph.D. thesis, University of California, Berkeley, 1991; and R Moazzami et al., "Endurance properties of Ferroelectric PZT thin films," Int. Electron Devices Mtg., San Francisco, 1990, pp. 417–20).

According to the teachings of the present invention, however, the devices are being written only once and not being fatigued. The devices will age in that the remnant and saturation polarization, Qr and Qs respectively as illustrated in FIG. 4, will degrade with time. (See generally, D. E. Fisch et al., "Analysis of thin film ferroelectric aging," Proc. IEEE Int. Reliability Physics Symp., March 1990, pp. 237–242). In the present invention, however, a sensitive address scheme is being employed to detect small differences in remenant polarization, Qr. There is a tendency of the devices to "imprint" or to prefer one state over another if it stays in one state for a long period of time. (See generally, S. W. Wood, "Ferroelectric memory design," M.A.Sc. thesis, University of Toronto, 1992). According to the teachings of the present invention, this is a desirable characteristic since the application is to write once for archival storage.

As stated above, the arrays of ferroelectric write once read only memory devices are conventiently realized by a modification of DRAM technology. The array structure would have no capacitors, but rather one where the plug goes directly to array plate, as shown in FIG. 3. That is, the transfer devices in conventional DRAM arrays are replaced by the ferroelectric memory type devices of the present invention, having both oxide and ferroelectric dielectrics in the gate stack. As explained in connection with FIG. 3, conventional transistors for address decode and sense amplifiers can be fabricated after this step with normal thin gate insulators of silicon oxide.

Figure 5A:
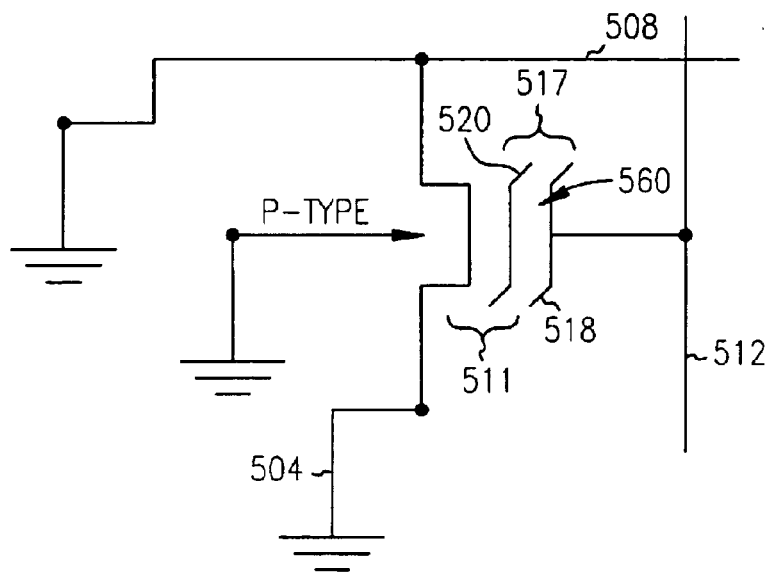
FIG. 5A illustrates the erase or reset of a ferroelectric gate dielectric according to the teachings of the present invention.
Figure 5B:
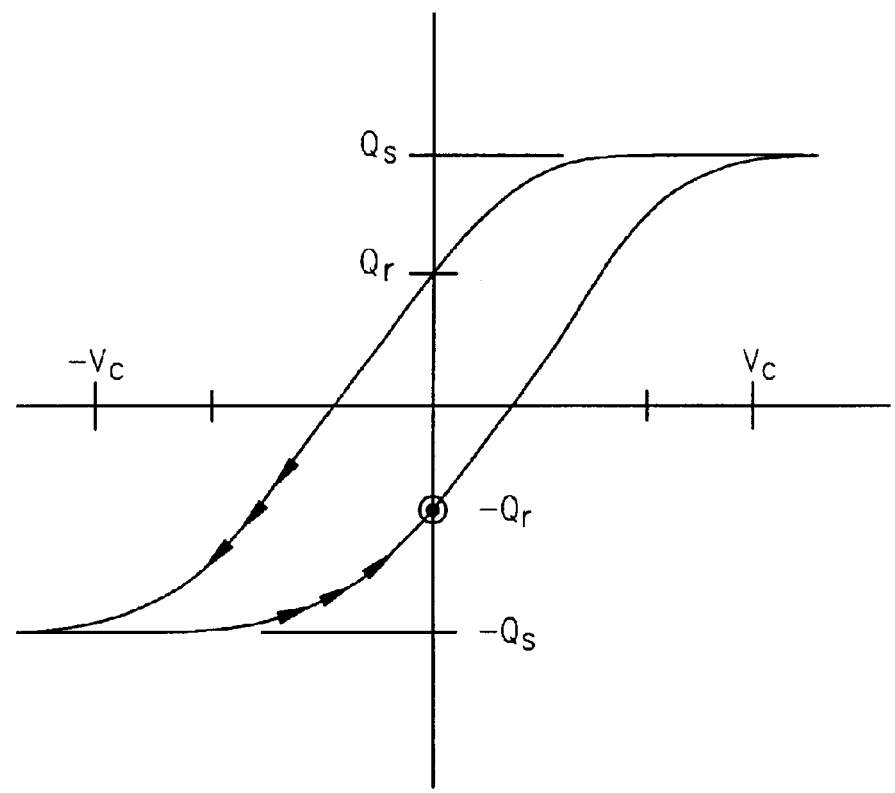
FIG. 5B is a graph plotting polarization charge versus applied voltage across a ferroelectric dielectric during the erase or reset operation shown in FIG. 5A.

FIG. 5A illustrates the erase or reset of a ferroelectric memory type device according to the teachings of the present invention. As mentioned above, the ferroelectric memory type device, or ferroelectric write once read only memory cell includes a gate stack having two capacitors in series. FIG. 5A illustrates the two capacitors in series as a first capacitor 511, formed between a channel region and a first gate, or transistor gate 520, and a second capacitor 517, formed between the transistor gate 520 and a control gate 518. According to the teachings of the present invention, the transistor gate 520 and the control gate 518 are separated by a ferroelectric dielectric 560 to form the second capacitor 517. Because the devices in the array act like ferroelectrics they could be erased or reset by biasing the word or address line 512, and consequently the control or address gate 518, with a large negative potential while grounding the array plate 504 and the bitline 508. FIG. 5B is a graph plotting polarization charge versus applied voltage across the ferroelectric dielectric 560 during the erase or reset operation shown in FIG. 5A. As shown in FIG. 5B, the polarization charge is taken to a negative saturation charge, −Qs, as the large negative potential, −Vc, is applied to the control or address gate 518 and then returns to a negative remnant polarization charge, −Qr, once the potential applied to the control or address gate 518 is removed.

Figure 6A:
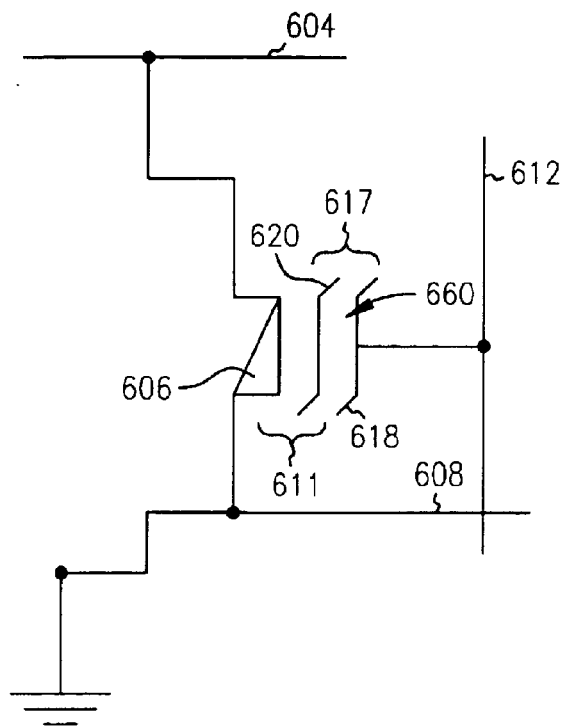
FIG. 6A illustrates the write operation of data on to the ferroelectric material of a selected device according to the teachings of the present invention.
Figure 6B:
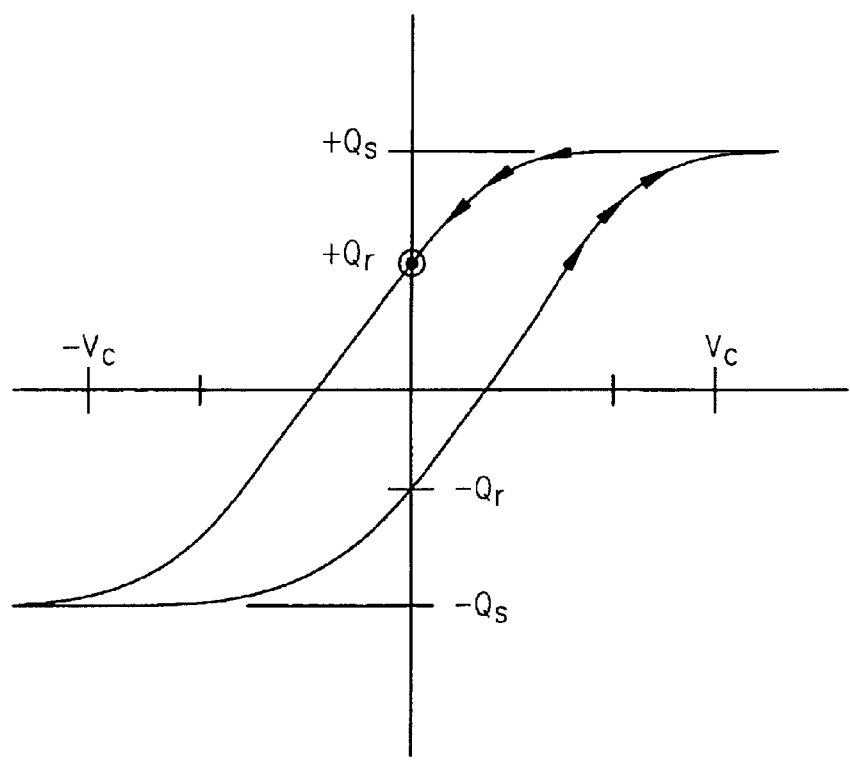
FIG. 6B is a graph plotting polarization charge versus applied voltage across a ferroelectric dielectric during the write operation shown in FIG. 6A.

FIG. 6A illustrates the write operation of data on to the ferroelectric memory type device according to the teachings of the present invention. As mentioned above, the ferroelectric memory type device, or ferroelectric write once read only memory cell includes a gate stack having two capacitors in series. FIG. 6A illustrates the two capacitors in series as a first capacitor 611, formed between a channel region 606 and a first gate, or transistor gate 620, and a second capacitor 617, formed between the transistor gate 620 and a control gate 618. According to the teachings of the present invention, the transistor gate 620 and the control gate 618 are separated by a ferroelectric dielectric 660 to form the second capacitor 617. As shown in FIG. 6A, the devices are written by a large positive, +Vc, word line address voltage 612 applied to the control or address gate 618 while the bit or data line 608 is grounded and the array plate 604 is held at a positive potential, e.g. some fractional value of Vdd resulting in a large positive voltage across the ferroelectric dielectric 660 as shown in FIG. 6B. As shown in FIG. 6B, the polarization charge is taken to a positive saturation charge, +Qs, as the large positive potential, +Vc, is applied to the control or address gate 618 and then returns to a positive remnant polarization charge, +Qr, once the potential applied to the control or address gate 618 is removed. The transistor will be saturated and conduct current during the write operation but a large positive potential will still exist across the gate dielectrics since the bit or data line 608 is at ground and the channel 606 is near ground potential.

During read the devices would operate as normal transistors with the array plate 604 and source at ground and the bit line 608 and the drain of the transistor precharged to some fractional voltage of Vdd as shown in FIG. 6A. If the device is addressed by the word line 612 then its conductivity will be determined by the presence or absence of stored polarization charge on the ferroelectric dielectric 660. The array would thus be addressed and read in the conventional manner used in DRAM's.

Figure 7:
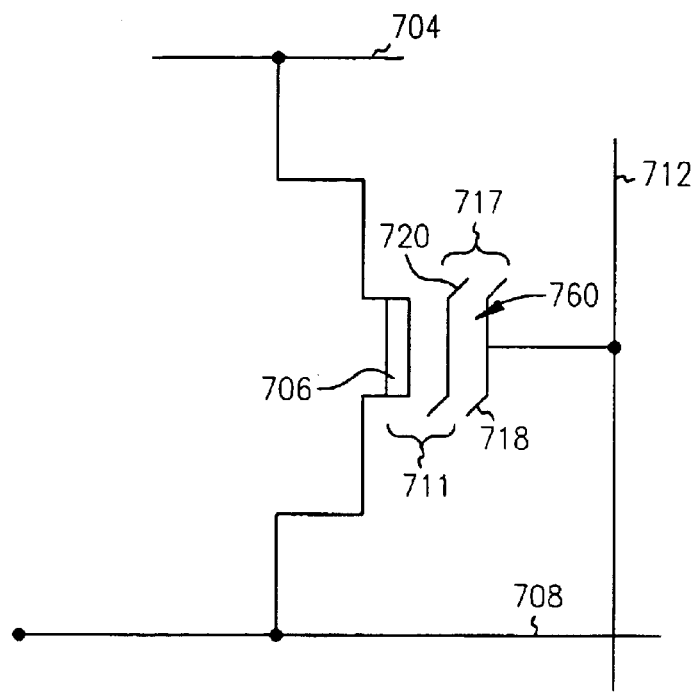
FIG. 7 illustrates the electrical state of a non-selected device according to the teachings of the present invention.

FIG. 7 illustrates the electrical state of a non-selected ferroelectric memory type device according to the teachings of the present invention. As mentioned above, the ferroelectric memory type device, or ferroelectric write once read only memory cell includes a gate stack having two capacitors in series. FIG. 7 illustrates the two capacitors in series as a first capacitor 711, formed between a channel region 706 and a first gate, or transistor gate 720, and a second capacitor 717, formed between the transistor gate 720 and a control gate 718. According to the teachings of the present invention, the transistor gate 720 and the control gate 718 are separated by a ferroelectric dielectric 760 to form the second capacitor 717. A word line, or address line 712 is coupled to the control gate 718.

During the write operation, non-selected devices would have not only the array plate 704 (and consequently the source) at a positive voltage but also the bit or data line 708 at a positive voltage. These devices would be operating in the linear region with the channel 706 at the same positive voltage as the drain and source. Consequently there would be only a small potential drop across the gate dielectrics and the voltage across the ferroelectric material 760 would not exceed the coercive or programming voltage. These devices would remain in their original state.

Figure 8:
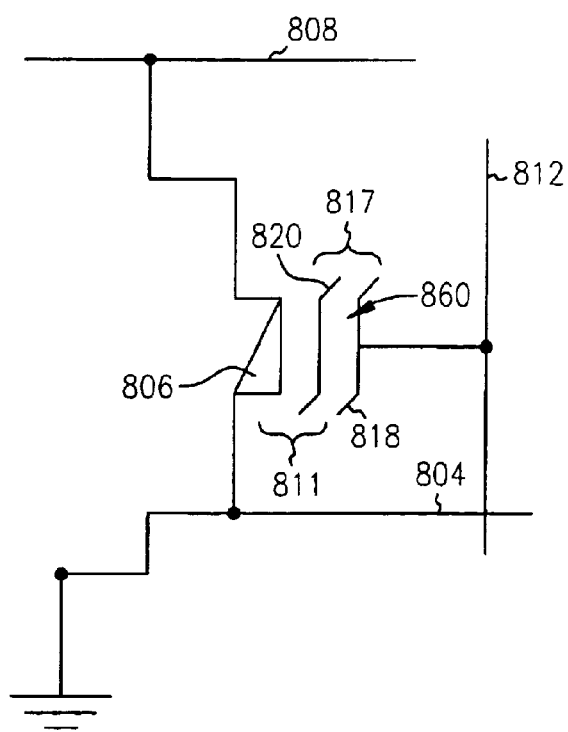
FIG. 8 illustrates the electrical state of a selected device according to the teachings of the present invention.

FIG. 8 illustrates the electrical state of a selected a ferroelectric memory type device according to the teachings of the present invention. As mentioned above, the ferroelectric memory type device, or ferroelectric write once read only memory cell includes a gate stack having two capacitors in series. FIG. 8 illustrates the two capacitors in series as a first capacitor 811, formed between a channel region 806 and a first gate, or transistor gate 820, and a second capacitor 817, formed between the transistor gate 820 and a control gate 818. According to the teachings of the present invention, the transistor gate 820 and the control gate 818 are separated by a ferroelectric dielectric 860 to form the second capacitor 817. As shown in FIG. 8, the array plate 804 (and consequently source) of the selected device is coupled to ground, the bitline 808 (and consequently drain) of the selected device is precharged to a positive potential, and the selected device is addressed by a positive word line address 812. In a read operation, device characteristics due to the "imprint" of information stored in the ferroelectric capacitor 860 of a selected device in the memory array is compared to an unpolarized or dummy device/cell as shown in FIG. 3. The negative gate voltage erase feature would be used during manufacture and test to initially program all devices to have similar or matching conductivity before use in the field, the sense amplifier can then detect small differences in device characteristics due to polarization induced changes in device characteristics during the write operation.

Figure 9:
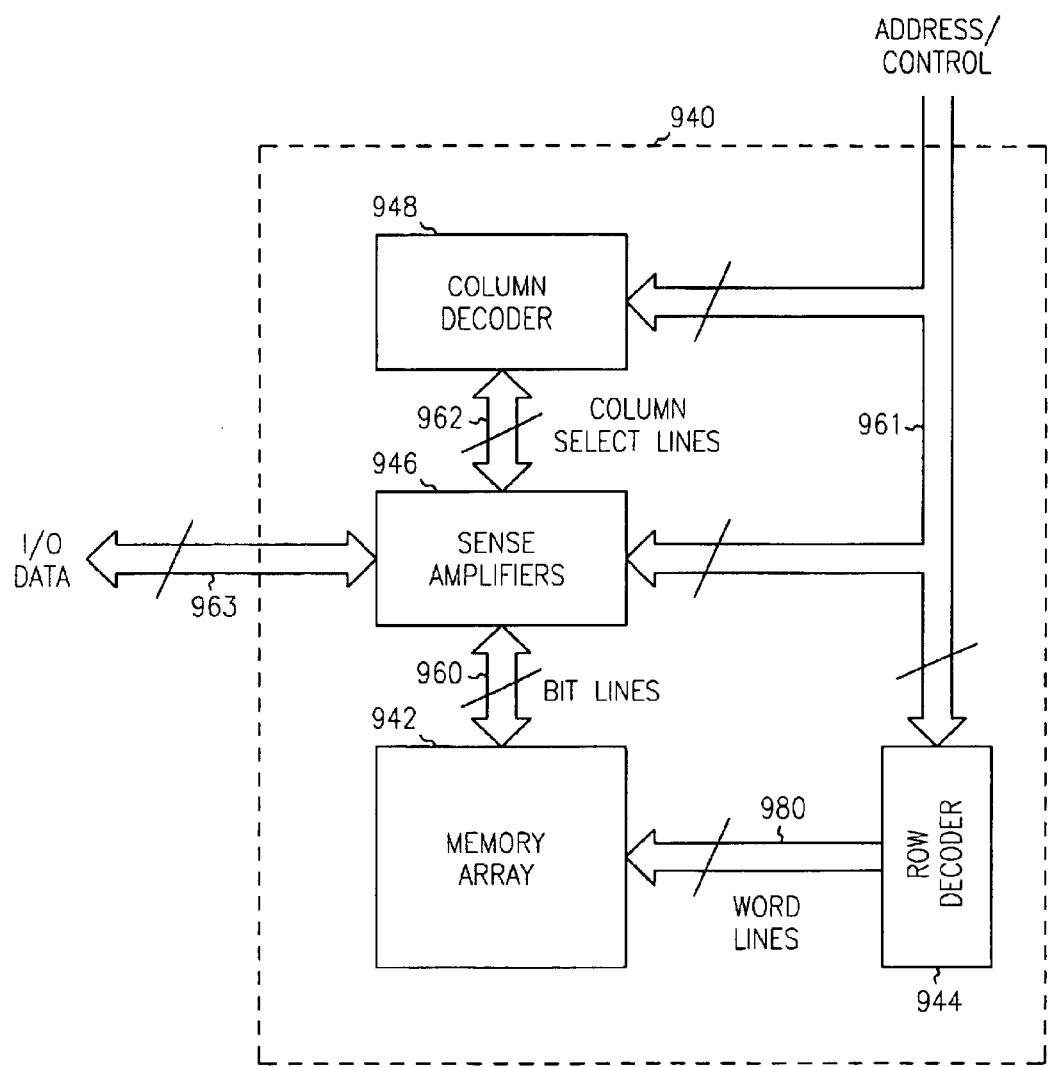
FIG. 9 illustrates a memory device according to the teachings of the present invention.

In FIG. 9 a memory device is illustrated according to the teachings of the present invention. The memory device 940 contains a memory array 942, row and column decoders 944, 948 and a sense amplifier circuit 946. The memory array 942 consists of a plurality of ferroelectric write once read only memory cells, formed according to the teachings of the present invention, whose word lines 980 and bit lines 960 are commonly arranged into rows and columns, respectively. The bit lines 960 of the memory array 942 are connected to the sense amplifier circuit 946, while its word lines 980 are connected to the row decoder 944. Address and control signals are input on address/control lines 961 into the memory device 940 and connected to the column decoder 948, sense amplifier circuit 946 and row decoder 944 and are used to gain read and write access, among other things, to the memory array 942.

The column decoder 948 is connected to the sense amplifier circuit 946 via control and column select signals on column select lines 962. The sense amplifier circuit 946 receives input data destined for the memory array 942 and outputs data read from the memory array 942 over input/output (I/O) data lines 963. Data is read from the cells of the memory array 942 by activating a word line 980 (via the row decoder 944), which couples all of the memory cells corresponding to that word line to respective bit lines 960, which define the columns of the array. One or more bit lines 960 are also activated. When a particular word line 980 and bit lines 960 are activated, the sense amplifier circuit 946 connected to a bit line column detects and amplifies the conduction sensed through a given ferroelectric write once read only memory cell and transferred to its bit line 960 by measuring the potential difference between the activated bit line 960 and a reference line which may be an inactive bit line. Again, in the read operation the source region of a given cell is coupled to a grounded array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 10:
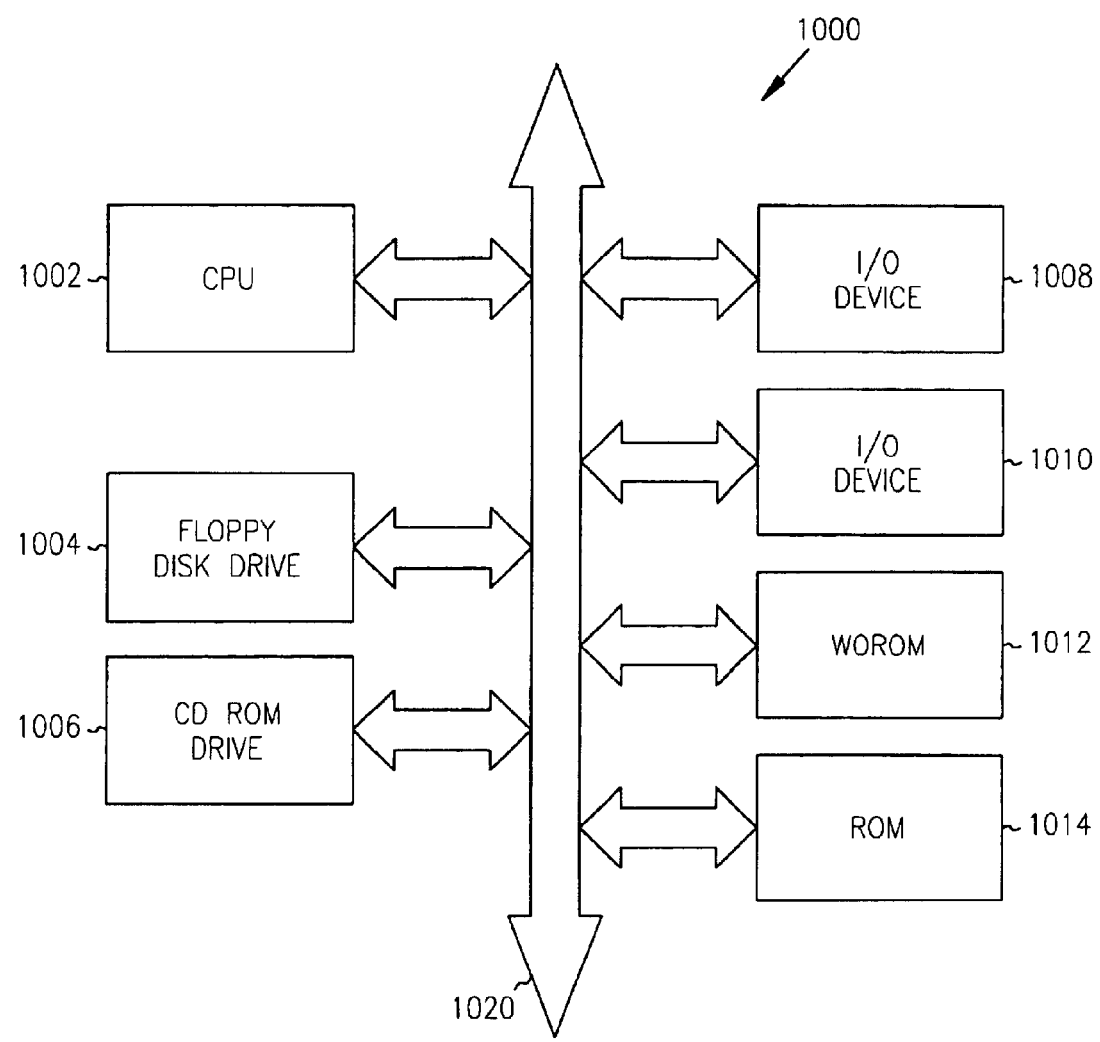
FIG. 10 is a block diagram of an electrical system, or processor-based system, utilizing ferroelectric write once read only memory constructed in accordance with the present invention.

FIG. 10 is a block diagram of an electrical system, or processor-based system, 1000 utilizing ferroelectric write once read only memory 1012 constructed in accordance with the present invention. That is, the ferroelectric write once read only memory (WOROM) 1012 utilizes the modified DRAM cell transistor as explained and described in detail in connection with FIGS. 2–8. The processor-based system 1000 may be a computer system, a process control system or any other system employing a processor and associated memory. The system 1000 includes a central processing unit (CPU) 1002, e.g., a microprocessor, that communicates with the write once read only memory 1012 and an I/O device 1008 over a bus 1020. It must be noted that the bus 1020 may be a series of buses and bridges commonly used in a processor-based system, but for convenience purposes only, the bus 1020 has been illustrated as a single bus. A second I/O device 1010 is illustrated, but is not necessary to practice the invention. The processor-based system 1000 can also includes read-only memory (ROM) 1014 and may include peripheral devices such as a floppy disk drive 1004 and a compact disk (CD) ROM drive 1006 that also communicates with the CPU 1002 over the bus 1020 as is well known in the art.

It will be appreciated by those skilled in the art that additional circuitry and control signals can be provided, and that the memory device 1000 has been simplified to help focus on the invention. At least one of the ferroelectric write once read only memory cell in WOROM 1012 includes a programmed transistor cell, having both oxide and ferroelectric dielectrics in therein and an "imprint" of information stored in the ferroelectric dielectric such that the programmed transistor operates at a reduced drain source current.

It will be understood that the embodiment shown in FIG. 10 illustrates an embodiment for electronic system circuitry in which the novel memory cells of the present invention are used. The illustration of system 1000, as shown in FIG. 10, is intended to provide a general understanding of one application for the structure and circuitry of the present invention, and is not intended to serve as a complete description of all the elements and features of an electronic system using the novel memory cell structures. Further, the invention is equally applicable to any size and type of memory device 1000 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Conclusion

Utilization of a modification of well established DRAM technology and arrays will serve to afford an inexpensive memory device. The high density of DRAM array structures will afford the storage of a large volume of digital data or images at a very low cost per bit. There are may applications where the data need only be written once for archival storage. The limited number of cycles of the ferroelectrics materials acting as dielectrics storing polarization charge will insure long retention and archival storage.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory array, comprising:
    an array plate;
    a number of memory cells, each cell including:
        a first source/drain region coupled to the array plate;
        a second source/drain region;
        a channel region between the first source/drain region and the second source/drain region;
        a dielectric layer located over the channel region;
        a gate electrode located over the dielectric layer;
        a ferroelectric dielectric coupled to the gate electrode; and
        a control electrode coupled to the ferroelectric dielectric.

2. The memory array of claim 1, wherein the ferroelectric dielectric layer is a fraction of the area of the gate electrode.

3. The memory array of claim 1, wherein the ferroelectric dielectric includes a PZT ferroelectric material.

4. The memory array of claim 1, wherein the control electrode includes a platinum control electrode, and wherein a platinum layer is further located between the gate electrode and the ferroelectric dielectric.

5. The memory array of claim 1, wherein the dielectric layer includes silicon oxide.

6. The memory array of claim 1, wherein the gate electrode includes polycrystalline silicon.

7. A memory device, comprising:
    an array plate;
    a number of memory cells, each cell including:
        a first source/drain region coupled to the array plate;
        a second source/drain region;
        a channel region between the first source/drain region and the second source/drain region;
        a dielectric layer located over the channel region;
        a gate electrode located over the dielectric layer;
        a ferroelectric dielectric coupled to the gate electrode;
        a control electrode coupled to the ferroelectric dielectric; and
    a sense amplifier circuit coupled to the second source/drain regions.

8. The memory device of claim 7, wherein the ferroelectric dielectric includes a PZT ferroelectric material.

9. The memory device of claim 7, wherein the control electrode includes a platinum control electrode, and wherein a platinum layer is further located between the gate electrode and the ferroelectric dielectric.

10. A memory array, comprising:
    an array plate;
    a number of memory cells, each cell including:
        a first source/drain region coupled to the array plate;
        a second source/drain region;
        a channel region between the first source/drain region and the second source/drain region; and a gate stack located over the channel region, wherein the gate stack includes two capacitors in series, wherein a first capacitor includes a semiconductor oxide dielectric and a second capacitor includes a ferroelectric dielectric.

11. The memory array of claim 10, wherein the second capacitor includes a first platinum portion and second platinum portion on opposite sides of the ferroelectric dielectric.

12. The memory array of claim 10, wherein the first capacitor includes a first semiconductor portion and a second semiconductor portion on opposite sides of the semiconductor oxide dielectric.

13. The memory array of claim 10, wherein the ferroelectric dielectric includes a PZT ferroelectric material.

14. The memory array of claim 10, wherein the semiconductor oxide dielectric includes silicon oxide.

15. A memory device, comprising:
    an array plate;
    a number of memory cells, each cell including:
        a first source/drain region coupled to the array plate;
        a second source/drain region;
        a channel region between the first source/drain region and the second source/drain region; and
        a gate stack located over the channel region, wherein the gate stack includes two capacitors in series, wherein a first capacitor includes a semiconductor oxide dielectric and a second capacitor includes a ferroelectric dielectric; and
    a sense amplifier circuit coupled to the second source/drain regions.

16. The memory device of claim 15, wherein the second capacitor includes a first platinum portion and second platinum portion on opposite sides of the ferroelectric dielectric.

17. The memory device of claim 15, wherein the first capacitor includes a first semiconductor portion and a second semiconductor portion on opposite sides of the semiconductor oxide dielectric.

18. A memory array, comprising:
    an array plate;
    a number of memory cells, each cell including:
        a first source/drain region coupled to the array plate;
        a second source/drain region;
        a channel region between the first source/drain region and the second source/drain region;
        a silicon oxide layer located over the channel region;
        a polysilicon layer located over the silicon oxide layer;
        a ferroelectric dielectric between a first platinum portion and a second platinum portion, wherein the first platinum portion is coupled to the polysilicon layer.

19. The memory array of claim 18, wherein the ferroelectric dielectric includes a PZT ferroelectric material.

20. The memory array of claim 18, wherein the ferroelectric dielectric and the second platinum portion are a fraction of the area of the polysilicon layer.

21. A memory array, comprising:
    an array plate;
    a number of memory cells, each cell including:
        a first source/drain region coupled to the array plate;
        a second source/drain region;
        a channel region between the first source/drain region and the second source/drain region;
        a dielectric layer located over the channel region;
        a gate electrode located over the dielectric layer;
        a dipole charge storing means coupled to the gate electrode; and
        a control electrode coupled to the dipole charge storing means.

22. The memory array of claim 21, wherein the dipole charge storing means includes a ferroelectric dielectric material.

23. The memory array of claim 21, wherein the dipole charge storing means includes a PZT ferroelectric material.

* * * * *

UNITED STATES PATENT AND TRADEMARK OFFICE
CERTIFICATE OF CORRECTION

PATENT NO.   : 6,952,362 B2  
DATED        : October 4, 2005  
INVENTOR(S)  : Forbes Page 1 of 1

It is certified that error appears in the above-identified patent and that said Letters Patent is hereby corrected as shown below:

<u>Title page,</u>
Item [56], References Cited, OTHER PUBLICATIONS,
"Akasaki, I.," reference, delete "0>x" and insert -- 0<x --.
"Cricchi, J R., et al.," reference, delete "(Dec. 1997)" and insert -- (Dec. 1977) --.
"Eitan, Boaz," reference, delete "21(ll)" and insert -- 21(11) --.
"Ferris–Prabhu, A V.," reference (third occurrence), delete "Tunneling" and insert
-- Tunnelling --; delete "Physics" and insert -- Physica --.
"Frohman–Bentchkowsky, D," reference, delete "Proceeds" and insert -- Proceedings --.
"Papadas, C.," reference, delete "Charcteristics" and insert -- Characteristics --.
"White, M H.," reference, delete "Programmme" and insert -- Programme --.
"Zhu, W, et al.," reference, delete "Tranport" and insert -- Transport --.

Signed and Sealed this

Twenty-eighth Day of March, 2006

JON W. DUDAS
*Director of the United States Patent and Trademark Office*